(12) United States Patent
Mori et al.

(10) Patent No.: US 12,431,864 B2
(45) Date of Patent: Sep. 30, 2025

(54) ACOUSTIC WAVE FILTER

(71) Applicant: Murata Manufacturing Co., Ltd., Nagaokakyo (JP)

(72) Inventors: Hirotsugu Mori, Nagaokakyo (JP); Syunsuke Kido, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 292 days.

(21) Appl. No.: 18/307,024

(22) Filed: Apr. 26, 2023

(65) Prior Publication Data

US 2023/0268906 A1    Aug. 24, 2023

Related U.S. Application Data

(63) Continuation of application No. PCT/JP2021/032738, filed on Sep. 6, 2021.

(30) Foreign Application Priority Data

Oct. 28, 2020    (JP) .................... 2020-180744

(51) Int. Cl.
*H03H 9/205* (2006.01)
*H03H 9/02* (2006.01)
(Continued)

(52) U.S. Cl.
CPC ........ *H03H 9/205* (2013.01); *H03H 9/02015* (2013.01); *H03H 9/171* (2013.01); *H03H 9/6483* (2013.01)

(58) Field of Classification Search
CPC .... H03H 9/6483; H03H 9/25; H03H 9/14541; H03H 9/02574; H03H 9/145;
(Continued)

(56) References Cited

U.S. PATENT DOCUMENTS

2019/0273481 A1*    9/2019  Michigami ........ H03H 9/14538

FOREIGN PATENT DOCUMENTS

JP    53-105156 A    9/1978
JP    H04-68908 A    3/1992
(Continued)

OTHER PUBLICATIONS

International Search Report and Written Opinion mailed on Nov. 9, 2021, received for PCT Application PCT/JP2021/032738, filed on Sep. 6, 2021, 9 pages including English Translation.

*Primary Examiner* — Lincoln D Donovan
*Assistant Examiner* — Tyler J Pereny
(74) *Attorney, Agent, or Firm* — XSENSUS LLP

(57) ABSTRACT

An acoustic wave filter includes a first ladder circuit including a first series arm resonator and a first parallel arm resonator, a second ladder circuit including a second series arm resonator and a second parallel arm resonator, and a third ladder circuit including a third series arm resonator and a third parallel arm resonator. The first, second and third ladder circuits are cascade-connected in order. A condition of fas1>fas2>fas3>frp1>frp2>frp3 is satisfied, where fas1 represents an anti-resonant frequency of the first series arm resonator, fas2 represents an anti-resonant frequency of the second series arm resonator, fas3 represents an anti-resonant frequency of the third series arm resonator, frp1 represents a resonant frequency of the first parallel arm resonator, frp2 represents a resonant frequency of the second parallel arm resonator, and frp3 represents a resonant frequency of the third parallel arm resonator.

20 Claims, 9 Drawing Sheets

(51) Int. Cl.
*H03H 9/17* (2006.01)
*H03H 9/64* (2006.01)

(58) Field of Classification Search
CPC ...... H03H 9/1457; H03H 9/542; H03H 9/725; H03H 9/02834; H03H 9/64; H03H 9/6403; H03H 9/568; H03H 9/0274; H03H 9/02992; H03H 9/14526; H03H 9/02637; H03H 9/205; H03H 9/605; H04B 1/40; H04B 1/0057; H04B 1/006; H04B 1/18
See application file for complete search history.

(56) References Cited

FOREIGN PATENT DOCUMENTS

| | | | |
|---|---|---|---|
| JP | 2003-243966 | A | 8/2003 |
| WO | 2015/198709 | A1 | 12/2015 |
| WO | 2017/159834 | A1 | 9/2017 |
| WO | 2019/188864 | A1 | 10/2019 |
| WO | 2020/036100 | A1 | 2/2020 |

\* cited by examiner fas1 > fas2 > fas3 > frp1 > frp2 > frp3 fas1 > fas2 > fas3 > frp1 > frp2 > frp3 fas1 > fas21(fas22) > fas3 > frp1 > frp21(frp22) > frp3

ACOUSTIC WAVE FILTER

CROSS-REFERENCE TO RELATED APPLICATIONS

This is a continuation application of PCT International Application No. PCT/JP2021/032738 filed on Sep. 6, 2021, designating the United States of America, which is based on and claims priority to Japanese Patent Application No. 2020-180744 filed on Oct. 28, 2020. The entire disclosures of the above-identified applications, including the specifications, drawings, and claims are incorporated herein by reference in their entirety.

BACKGROUND

1. Field of the Invention

The present disclosure relates to an acoustic wave filter.

2. Description of the Related Art

In recent years, an increased number of bands have been used in 5th Generation New Radio (5G NR), and characteristics required for filters compatible with the bands have been diversified. In general, when the band width ratio (band width/center frequency) of a required band is close to the resonant band width ratio ((anti-resonant frequency−resonant frequency)/resonant frequency) of a resonator included in a filter, good filter characteristics can be obtained. However, depending on a band, the band width ratio of the band may be smaller than the resonant band width ratio of a resonator.

For example, in Japanese Unexamined Patent Application Publication No. 4-68908, two filter circuits having pass bands overlapping each other are cascade-connected to implement a filter circuit having a band width ratio smaller than a resonant band width ratio.

SUMMARY

However, when two filter circuits having pass bands shifted in frequency are simply cascade-connected, as in the filter circuit described in Japanese Unexamined Patent Application Publication No. 4-68908, it is difficult to obtain good filter characteristics if the difference between the resonant band width ratio and the band width ratio of the band increases.

Accordingly, an aspect of the present disclosure is to provide an acoustic wave filter having a pass band width sufficiently smaller than a resonant band width (anti-resonant frequency−resonant frequency) and having good filter characteristics.

An acoustic wave filter according to an aspect of the present disclosure includes a first input/output terminal; a second input/output terminal; a first ladder circuit including a first series arm resonator and a first parallel arm resonator, the first series arm resonator being connected in series to a series arm path connecting the first input/output terminal and the second input/output terminal, the first parallel arm resonator being connected to a first parallel arm path connecting the series arm path and ground; a second ladder circuit including a second series arm resonator and a second parallel arm resonator, the second series arm resonator being connected in series to the series arm path, the second parallel arm resonator being connected to a second parallel arm path connecting the series arm path and ground; and a third ladder circuit including a third series arm resonator and a third parallel arm resonator, the third series arm resonator being connected in series to the series arm path, the third parallel arm resonator being connected to a third parallel arm path connecting the series arm path and ground. The first ladder circuit, the second ladder circuit, and the third ladder circuit are cascade-connected in order. A condition of $fas1 > fas2 > fas3 > frp1 > frp2 > frp3$ is satisfied, where $fas1$ represents an anti-resonant frequency of the first series arm resonator, $fas2$ represents an anti-resonant frequency of the second series arm resonator, $fas3$ represents an anti-resonant frequency of the third series arm resonator, $frp1$ represents a resonant frequency of the first parallel arm resonator, $frp2$ represents a resonant frequency of the second parallel arm resonator, and $frp3$ represents a resonant frequency of the third parallel arm resonator.

According to the present disclosure, it is possible to provide an acoustic wave filter having a pass band width sufficiently smaller than a resonant band width and having good filter characteristics.

DESCRIPTION OF THE EMBODIMENTS

Figure 1:
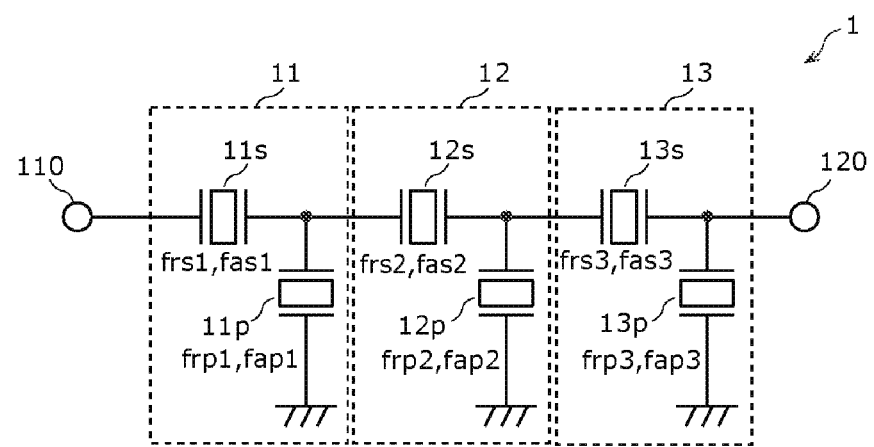
FIG. 1 is a circuit configuration diagram of an acoustic wave filter according to an embodiment.

Hereinafter, embodiments of the present disclosure will be described in detail with reference to the drawings. The embodiments, examples, and modifications described below each illustrate a general or specific example. The numerical values, shapes, materials, constituent elements, the arrangement and connection manner of the constituent elements, and so forth described in the following embodiments, examples, and modifications are merely examples, and are not intended to limit the present invention. Among the constituent elements in the following embodiments, examples, and modifications, constituent elements not described in an independent claim will be described as optional constituent elements. The sizes or size ratios of the constituent elements illustrated in the drawings are not necessarily strict.

In the following description, a "series arm path" and a "parallel arm path" each mean a transmission line including a wiring line through which a radio frequency (RF) signal propagates, an electrode directly connected to the wiring line, and a terminal directly connected to the wiring line or the electrode.

Embodiment

1. Circuit Configuration of Acoustic Wave Filter 1

FIG. 1 is a circuit configuration diagram of an acoustic wave filter 1 according to an embodiment. As illustrated in FIG. 1, the acoustic wave filter 1 includes ladder circuits 11, 12, and 13 and input/output terminals 110 and 120.

The ladder circuit 11 is an example of a first ladder circuit, and includes a series arm resonator 11s and a parallel arm resonator 11p. The series arm resonator 11s is disposed in series with a series arm path connecting the input/output terminals 110 and 120. The parallel arm resonator 11p is disposed on a first parallel arm path connecting the series arm path and ground.

The ladder circuit 12 is an example of a second ladder circuit, and includes a series arm resonator 12s and a parallel arm resonator 12p. The series arm resonator 12s is disposed in series with the series arm path. The parallel arm resonator 12p is disposed on a second parallel arm path connecting the series arm path and ground.

The ladder circuit 13 is an example of a third ladder circuit, and includes a series arm resonator 13s and a parallel arm resonator 13p. The series arm resonator 13s is disposed in series with the series arm path. The parallel arm resonator 13p is disposed on a third parallel arm path connecting the series arm path and ground.

The series arm resonators 11s, 12s, and 13s and the parallel arm resonators 11p, 12p, and 13p are each an acoustic wave resonator, specifically, a surface acoustic wave (SAW) resonator or a bulk acoustic wave (BAW) resonator.

The series arm resonator 11s has a resonant frequency frs1 and an anti-resonant frequency fas1. The parallel arm resonator 11p has a resonant frequency frp1 and an anti-resonant frequency fap1.

The series arm resonator 12s has a resonant frequency frs2 and an anti-resonant frequency fas2. The parallel arm resonator 12p has a resonant frequency frp2 and an anti-resonant frequency fap2.

The series arm resonator 13s has a resonant frequency frs3 and an anti-resonant frequency fas3. The parallel arm resonator 13p has a resonant frequency frp3 and an anti-resonant frequency fap3.

The ladder circuit 11, the ladder circuit 12, and the ladder circuit 13 are cascade-connected in this order from the input/output terminal 110.

Each of the ladder circuits 11 to 13 does not necessarily have a configuration including one series arm resonator and one parallel arm resonator, and may have a configuration including one or more series arm resonators and one or more parallel arm resonators. Note that, in this case, the difference in resonant frequency and the difference in anti-resonant frequency between a plurality of series arm resonators included in one ladder circuit are each 50% or less of the pass band width of the acoustic wave filter 1, and the difference in resonant frequency and the difference in anti-resonant frequency between a plurality of parallel arm resonators included in one ladder circuit are each 50% or less of the pass band width of the acoustic wave filter 1.

2. Structure of Acoustic Wave Resonator

Next, an example structure of an acoustic wave resonator included in the acoustic wave filter 1 will be described.

Figure 2A:
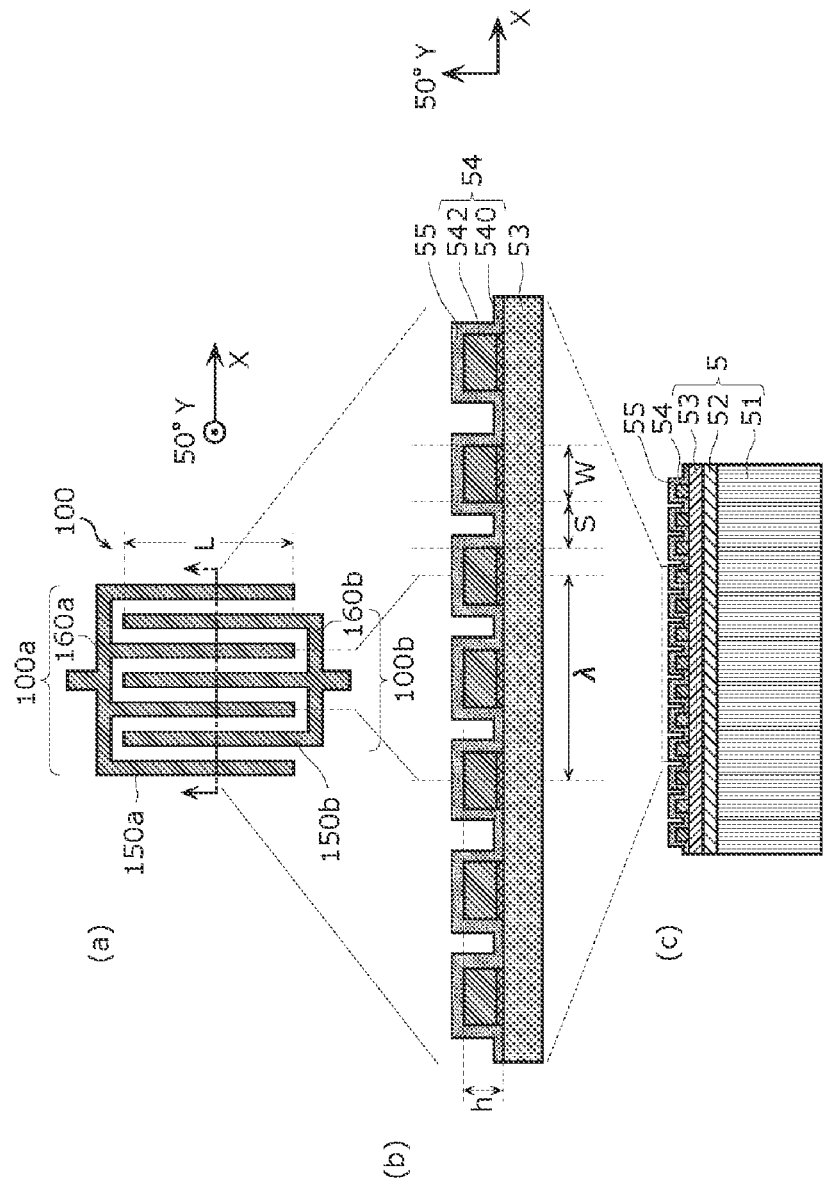
FIG. 2A includes a plan view and sectional views schematically illustrating an example of a surface acoustic wave (SAW) resonator according to the embodiment.

FIG. 2A includes a plan view and sectional views schematically illustrating an example of a SAW resonator according to the embodiment, in which part (a) is a plan view, and parts (b) and (c) are sectional views taken along the dotted-chain line illustrated in part (a). FIG. 2A illustrates a SAW resonator 100 having a basic structure of the series arm resonator and the parallel arm resonator included in each of the ladder circuits 11 to 13. The SAW resonator 100 illustrated in FIG. 2A is for describing a typical structure of an acoustic wave resonator, and the number and lengths of electrode fingers included in an electrode are not limited to those illustrated herein.

The SAW resonator 100 includes a piezoelectric substrate 5 and comb-shaped electrodes 100a and 100b.

As illustrated in part (a) of FIG. 2A, the comb-shaped electrodes 100a and 100b are opposed to each other and form a pair are of comb-shaped electrodes that are disposed on the substrate 5. The comb-shaped electrode 100a includes a plurality of electrode fingers 150a that are parallel to each other, and a busbar electrode 160a connecting the plurality of electrode fingers 150a. The comb-shaped electrode 100b includes a plurality of electrode fingers 150b that are parallel to each other, and a busbar electrode 160b connecting the plurality of electrode fingers 150b. The plurality of electrode fingers 150a and the plurality of electrode fingers 150b extend in a direction orthogonal to an acoustic wave propagation direction (X-axis direction).

The plurality of electrode fingers 150a, the plurality of electrode fingers 150b, and the busbar electrodes 160a and 160b constitute an interdigital transducer (IDT) electrode 54, which has a multilayer structure of an adhesion layer 540 and a main electrode layer 542, as illustrated in part (b) of FIG. 2A.

A protective layer 55 is disposed so as to cover the comb-shaped electrodes 100a and 100b. The protective layer 55 has purposes of protecting the main electrode layer 542 from an external environment, adjusting a frequency-temperature characteristic, enhancing moisture resistance, and so forth. The protective layer 55 is, for example, a dielectric film containing silicon dioxide as a main component.

The IDT electrode 54 need not necessarily have the above-described multilayer structure. The IDT electrode 54 may be made of, for example, a metal such as Ti, Al, Cu, Pt, Au, Ag, or Pd, or an alloy thereof, or may be formed of a plurality of multilayer bodies made of the above metals or alloys. The protective layer 55 need not necessarily be provided.

Next, the multilayer structure of the substrate 5 will be described.

As illustrated in part (c) of FIG. 2A, the substrate 5 includes a high-acoustic-velocity support substrate 51, a low-acoustic-velocity film 52, and a piezoelectric film 53, which are laminated one on top of another in this order.

The piezoelectric film 53 is made of a LiTaO$_3$ piezoelectric single crystal or piezoelectric ceramics.

The high-acoustic-velocity support substrate 51 is a substrate for supporting the low-acoustic-velocity film 52, the piezoelectric film 53, and the IDT electrode 54. The high-acoustic-velocity support substrate 51 is a substrate configured such that the acoustic velocity of a bulk wave in the high-acoustic-velocity support substrate 51 is higher than the acoustic velocity of an acoustic wave such as a surface acoustic wave or a boundary acoustic wave propagating in the piezoelectric film 53, and functions to confine a surface acoustic wave in a portion where the piezoelectric film 53 and the low-acoustic-velocity film 52 are laminated and not to allow a surface acoustic wave to leak to a portion below the high-acoustic-velocity support substrate 51.

The low-acoustic-velocity film 52 is a film configured such that the acoustic velocity of a bulk wave in the low-acoustic-velocity film 52 is lower than the acoustic velocity of a bulk wave propagating in the piezoelectric film 53, and is disposed between the piezoelectric film 53 and the high-acoustic-velocity support substrate 51. This structure and the intrinsic property of an acoustic wave: the energy concentrates on a low-acoustic-velocity medium, reduce the leakage of surface acoustic wave energy to the outside of the IDT electrode.

The above-described multilayer structure of the substrate 5 makes it possible to significantly increase the quality factors at the resonant frequency and the anti-resonant frequency, as compared with an existing structure in which a piezoelectric substrate is used as a single layer. That is, acoustic wave resonators having a large quality factor can be formed. With use of such acoustic wave resonators, a filter having a small insertion loss can be obtained.

The high-acoustic-velocity support substrate 51 may have a structure in which a support substrate and a high-acoustic-velocity film are laminated one on top of another. The high-acoustic-velocity film is configured such that the acoustic velocity of a bulk wave propagating therein is higher than the acoustic velocity of an acoustic wave such as a surface acoustic wave or a boundary acoustic wave propagating in the piezoelectric film 53.

Figure 2B:
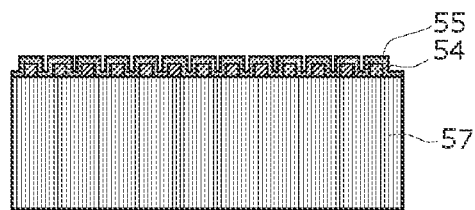
FIG. 2B is a sectional view schematically illustrating a SAW resonator according to a modification of the embodiment.

FIG. 2B is a sectional view schematically illustrating a SAW resonator according to a modification of the embodiment. In the SAW resonator 100 illustrated in FIG. 2A, the IDT electrode 54 is disposed on the substrate 5 including the piezoelectric film 53. The substrate on which the IDT electrode 54 is disposed may be a piezoelectric single crystal substrate 57 formed of a single piezoelectric layer, as illustrated in FIG. 2B. The piezoelectric single crystal substrate 57 is made of, for example, a LiNbO$_3$ piezoelectric single crystal. The SAW resonator 100 according to the present modification includes the piezoelectric single crystal substrate 57 of LiNbO$_3$, the IDT electrode 54, and the protective layer 55 disposed on the piezoelectric single crystal substrate 57 and the IDT electrode 54.

The above-described piezoelectric film 53 and the piezoelectric single crystal substrate 57 may be changed as appropriate in multilayer structure, material, cut-angles, and thickness, in accordance with a required bandpass characteristic of the acoustic wave filter device.

The substrate on which the IDT electrode 54 is disposed may have a structure in which a support substrate, an energy confinement layer, and a piezoelectric film are laminated one on top of another in this order. The IDT electrode 54 is disposed on the piezoelectric film. The piezoelectric film is made of, for example, a LiTaO$_3$ piezoelectric single crystal or piezoelectric ceramics. The support substrate is a substrate for supporting the piezoelectric film, the energy confinement layer, and the IDT electrode 54.

A surface acoustic wave refers to an acoustic wave that propagates on a surface of a piezoelectric substrate or an interface between a plurality of materials, and includes various types of acoustic waves generated using an IDT electrode. A surface acoustic wave includes, for example, a surface wave, a Love wave, a leaky wave, a Rayleigh wave, a boundary wave, a leaky SAW, a pseudo SAW, and a Lamb wave.

Next, a BAW resonator will be described. A BAW resonator is formed of a solidly mounted resonator (SMR) or a film bulk acoustic resonator (FBAR).

An SMR-type BAW resonator includes, for example, a Si substrate, a lower electrode, an upper electrode, a piezoelectric layer, a low-acoustic-impedance film, and a high-acoustic-impedance film. An acoustic multilayer film is disposed above the Si substrate. The acoustic multilayer film has a structure in which a low-acoustic-impedance film and a high-acoustic-impedance film are alternately laminated. The lower electrode is disposed above the acoustic multilayer film, and the upper electrode is disposed above the lower electrode. The piezoelectric layer is disposed between the lower electrode and the upper electrode. With this structure, the SMR-type BAW resonator confines a bulk acoustic wave above the acoustic multilayer film by using Bragg reflection by the acoustic multilayer film disposed between the Si substrate and a set of the lower electrode, the upper electrode, and the piezoelectric layer.

An FBAR-type BAW resonator includes, for example, a Si substrate, a lower electrode, an upper electrode, and a piezoelectric layer. The Si substrate is an example of a support substrate. The lower electrode is disposed above the Si substrate, and the upper electrode is disposed above the lower electrode. The piezoelectric layer is disposed between the lower electrode and the upper electrode. The FBAR-type BAW resonator further has a cavity in the Si substrate. This structure generates a bulk acoustic wave in the laminating direction excited between the lower electrode and the upper electrode.

3. Operation Principle of Ladder Circuit

Figure 3:
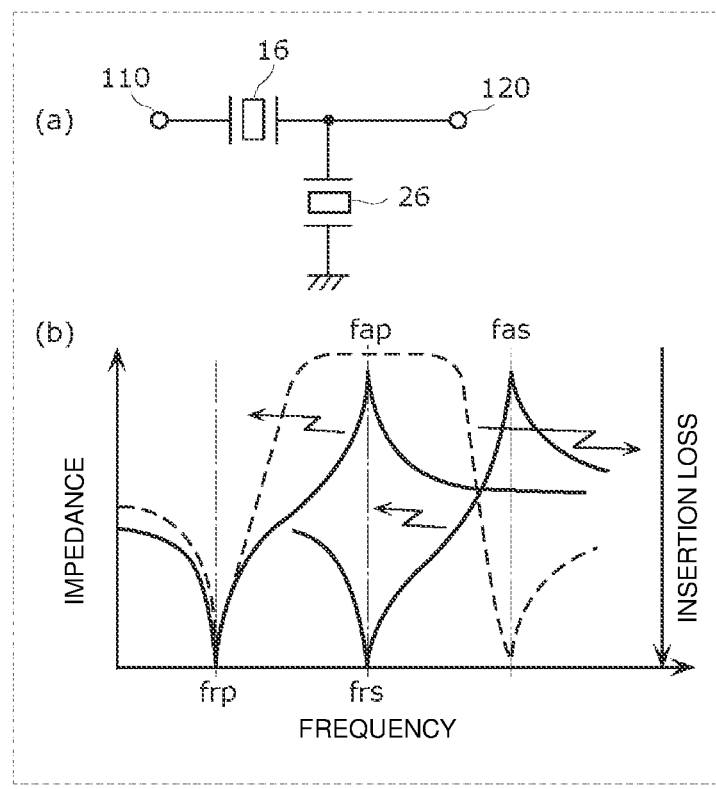
FIG. 3 includes a circuit configuration diagram for describing a basic operation principle of a ladder circuit, and a graph illustrating frequency characteristics.

Next, the operation principle of the ladder circuits 11 to 13 according to the present embodiment will be described. FIG. 3 includes a circuit configuration diagram for describing a basic operation principle of a ladder circuit, and a graph illustrating frequency characteristics.

The ladder circuit illustrated in part (a) of FIG. 3 is a basic ladder filter including one series arm resonator 16 and one parallel arm resonator 26. As illustrated in part (b) of FIG. 3, the parallel arm resonator 26 has a resonant frequency frp and an anti-resonant frequency fap (>frp) in the resonance characteristic. The series arm resonator 16 has a resonant frequency frs and an anti-resonant frequency fas (>frs>frp) in the resonance characteristic.

In the case of forming a band pass filter using a ladder circuit, the anti-resonant frequency fap of the parallel arm resonator 26 and the resonant frequency frs of the series arm resonator 16 are typically made close to each other. Accordingly, the resonant frequency frp and the vicinity thereof, where the impedance of the parallel arm resonator 26 approaches 0, serve as a low-frequency-side stop band. As the frequency increases, the impedance of the parallel arm resonator 26 increases at and around the anti-resonant frequency fap, and the impedance of the series arm resonator 16 approaches 0 at and around the resonant frequency frs. Accordingly, a region between the anti-resonant frequency fap and the resonant frequency frs and the vicinity thereof serve as a signal pass band in the signal path from the input/output terminal 110 to the input/output terminal 120. This makes it possible to form a pass band reflecting the electrode parameters and electromechanical coupling coefficients of the acoustic wave resonators. As the frequency further increases, the impedance of the series arm resonator 16 increases at and around the anti-resonant frequency fas. This region serves as a high-frequency-side stop band.

In an acoustic wave filter having the above-described operation principle, an RF signal input from the input/output terminal 110 or 120 causes a potential difference between a reference terminal and the input/output terminal 110 or 120. This causes the piezoelectric layer to be distorted, generating a surface acoustic wave. When the wavelength λ of the IDT electrode 54 is substantially equal to the wavelength of the pass band, only RF signals having frequency components to be passed pass through the acoustic wave filter.

The number of resonance stages, each including a parallel arm resonator and a series arm resonator, is appropriately optimized in accordance with required specifications. Typically, when the acoustic wave filter includes a plurality of resonance stages, the anti-resonant frequencies fap of a plurality of parallel arm resonators and the resonant frequencies frs of a plurality of series arm resonators are arranged in the pass band or the vicinity thereof. In addition, the resonant frequencies frp of the plurality of parallel arm resonators are arranged in the low-frequency-side stop band, and the anti-resonant frequencies fas of the plurality of series arm resonators are arranged in the high-frequency-side stop band.

According to the above-described operation principle of the ladder circuit, the steepness at the low-frequency-side end portion of the pass band in the bandpass characteristic strongly depends on the differences between the resonant frequencies frp and the anti-resonant frequencies fap of the plurality of parallel arm resonators (resonant band widths). That is, as the resonant band width of each of the plurality of parallel arm resonators decreases, the slope of the straight line connecting the resonant frequency frp and the anti-resonant frequency fap increases (with respect to a horizontal line), and thus the steepness at the low-frequency-side end portion of the pass band in the bandpass characteristic increases. Similarly, the steepness at the high-frequency-side end portion of the pass band in the bandpass characteristic strongly depends on the differences between the resonant frequencies frs and the anti-resonant frequencies fas of the plurality of series arm resonators (resonant band widths). That is, as the resonant band width of each of the plurality of series arm resonators decreases, the slope of the straight line connecting the resonant frequency frs and the anti-resonant frequency fas increases (with respect to a horizontal line), and thus the steepness at the high-frequency-side end portion of the pass band in the bandpass characteristic increases.

The insertion loss in the pass band strongly depends on the quality factors of the plurality of parallel arm resonators at the anti-resonant frequency fap and the quality factors of the plurality of series arm resonators at the resonant frequency frs. That is, as the quality factors of the plurality of parallel arm resonators at the anti-resonant frequency fap increase, the insertion loss in the pass band decreases, and as the quality factors of the plurality of series arm resonators at the resonant frequency frs increase, the insertion loss in the pass band decreases.

According to the above-described basic operation principle of the ladder circuit, the insertion loss and steepness of the pass band of the acoustic wave filter 1 according to the present embodiment are determined by adjusting the resonant frequencies, anti-resonant frequencies, resonant band widths, quality factors, and so forth of the individual series arm resonators and the individual parallel arm resonators.

4. Bandpass Characteristic of Acoustic Wave Filter 1

Figure 4:
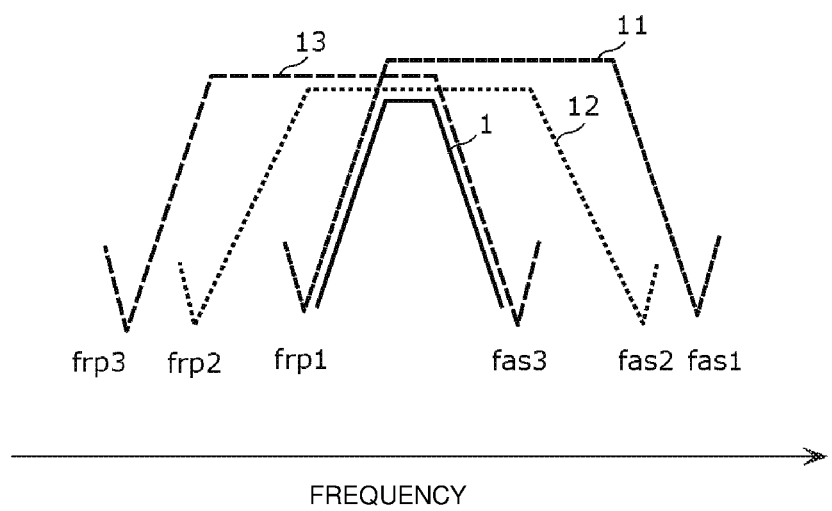
FIG. 4 is a diagram schematically illustrating the bandpass characteristics of ladder circuits included in the acoustic wave filter according to the embodiment.

FIG. 4 is a diagram schematically illustrating the bandpass characteristics of the ladder circuits 11 to 13 included in the acoustic wave filter 1 according to the embodiment. As illustrated in FIG. 4, the ladder circuits 11 to 13 have respective pass bands and attenuation bands in accordance with the above-described operation principle of the ladder circuit.

As illustrated in FIG. 4, in the ladder circuit 11, the attenuation pole near the low-frequency side of the pass band is defined by the resonant frequency frp1, and the attenuation pole near the high-frequency side of the pass band is defined by the anti-resonant frequency fas1. Similarly, in the ladder circuit 12, the attenuation pole near the low-frequency side of the pass band is defined by the resonant frequency frp2, and the attenuation pole near the high-frequency side of the pass band is defined by the anti-resonant frequency fas2. Similarly, in the ladder circuit 13, the attenuation pole near the low-frequency side of the pass band is defined by the resonant frequency frp3, and the attenuation pole near the high-frequency side of the pass band is defined by the anti-resonant frequency fas3.

According to the above-described bandpass characteristics, the pass band width of the ladder circuit 11 substantially corresponds to the resonant band width of the series arm resonator 11s and the resonant band width of the parallel arm resonator 11p, the pass band width of the ladder circuit 12 substantially corresponds to the resonant band width of the series arm resonator 12s and the resonant band width of the parallel arm resonator 12p, and the pass band width of the ladder circuit 13 substantially corresponds to the resonant band width of the series arm resonator 13s and the resonant band width of the parallel arm resonator 13p.

The acoustic wave filter 1 has a circuit configuration in which the ladder circuits 11 to 13 are cascade-connected, and thus the pass band of the acoustic wave filter 1 is defined as a band in which the pass bands of the ladder circuits 11 to 13 overlap each other.

In the acoustic wave filter 1 according to the present embodiment, the following expression is satisfied.

$$fas1 > fas2 > fas3 > frp1 > frp2 > frp3 \quad \text{(Expression 1)}$$

Accordingly, the attenuation pole near the low-frequency side of the pass band of the acoustic wave filter 1 is defined by the resonant frequency frp1, which is the highest among the three resonant frequencies frp1, frp2, and frp3. On the other hand, the attenuation pole near the high-frequency side of the pass band of the acoustic wave filter 1 is defined by the anti-resonant frequency fas3, which is the lowest among the three anti-resonant frequencies fas1, fas2, and fas3.

With use of the ladder circuits 11 to 13 including acoustic wave resonators having a relatively large resonant band width, the acoustic wave filter 1 having a pass band smaller than the resonant band width can be implemented. In addition, because at least the ladder circuit 12 has a pass band width larger than the pass band width of the acoustic wave filter 1, a large attenuation can be secured in the attenuation band far from the pass band formed by the ladder circuit 12. This makes it possible to provide the acoustic wave filter 1 having a large attenuation and a pass band that is narrower than the pass bands and resonant bands of the ladder circuits 11 to 13.

Furthermore, because the ladder circuits 11, 12, and 13 are arranged in this order between the input/output terminals 110 and 120, the frequency difference between adjacent ladder circuits can be reduced. This makes it possible to achieve good impedance matching between adjacent ladder circuits. Thus, mismatching loss between the ladder circuits can be reduced, and the acoustic wave filter 1 having low loss can be provided.

The acoustic wave filter 1 according to the present embodiment is applicable as, for example, a filter for band n47 (5855-5925 MHz) of 5th Generation New Radio (5G NR). In this case, each of the ladder circuits 11, 12, and 13 is, for example, a circuit having a resonant band width corresponding to the band width of band n46 (5150-5925 MHz) of 5G NR. Alternatively, each of the ladder circuits 11, 12, and 13 is, for example, a circuit having a resonant band width corresponding to the band width of band n97 (5925-7125 MHz) of 5G NR. Accordingly, a low-loss filter for band n47 of 5G NR can be provided.

In addition, the acoustic wave filter 1 according to the present embodiment is applicable as, for example, a filter for band n42 (3400-3600 MHz) of 5G NR, a filter for band n48 (n49) (3550-3700 MHz) of 5G NR, or a filter for band n52 (3300-3400 MHz) of 5G NR. In this case, each of the ladder circuits 11, 12, and 13 is, for example, a circuit having a resonant band width corresponding to the band width of band n77 (3300-4200 MHz) of 5G NR. Accordingly, a low-loss filter for band n42 of 5G NR, a low-loss filter for band n48 (n49) of 5G NR, or a low-loss filter for band n52 of 5G NR can be provided.

In the band application examples of the acoustic wave filter 1 according to the present embodiment, the applied band is not limited to a band for 5G NR and may be a band for 4th Generation Long Term Evolution (4G LTE). Furthermore, the band to which the acoustic wave filter 1 is applied is not limited to a band for 5G NR or 4G LTE, as long as the band is a frequency band defined in advance by a standardizing body or the like for a communication system.

5. Bandpass Characteristic of Acoustic Wave Filter 1A According to Example

Figure 5:
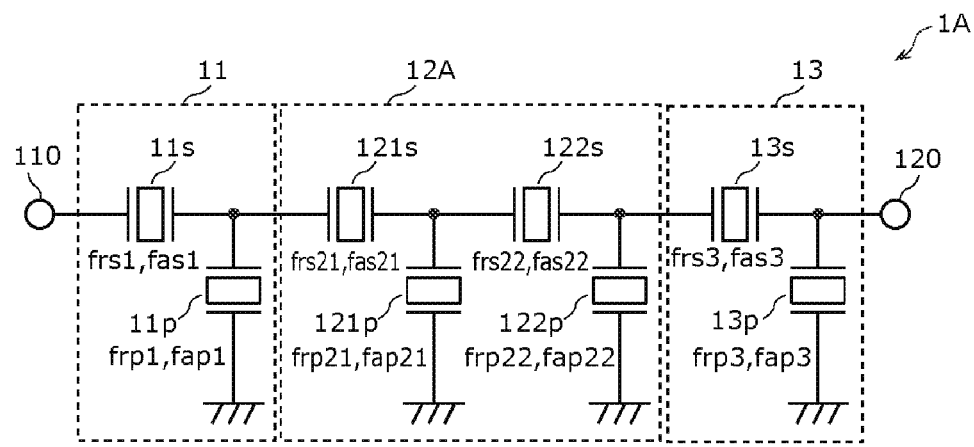
FIG. 5 is a circuit configuration diagram of an acoustic wave filter according to example 1.

FIG. 5 is a circuit configuration diagram of an acoustic wave filter 1A according to example 1. As illustrated in FIG. 5, the acoustic wave filter 1A includes ladder circuits 11, 12A, and 13 and input/output terminals 110 and 120. The acoustic wave filter 1A according to the present example is different from the acoustic wave filter 1 according to the embodiment in that the ladder circuit 12 is replaced with the ladder circuit 12A. Hereinafter, the acoustic wave filter 1A according to the present example will be described, focusing on differences from the acoustic wave filter 1 according to the embodiment and omitting the same points.

The ladder circuit 12A is an example of a second ladder circuit, and includes series arm resonators 121s and 122s and parallel arm resonators 121p and 122p. The series arm resonators 121s and 122s are disposed in series with a series arm path connecting the input/output terminals 110 and 120. The parallel arm resonator 121p is disposed on a parallel arm path connecting a connection node between the series arm resonators 121s and 122s and ground. The parallel arm resonator 122p is disposed on a parallel arm path connecting a connection node between the series arm resonators 122s and 13s and ground.

The series arm resonators 121s and 122s and the parallel arm resonators 121p and 122p are each an acoustic wave resonator, specifically, a SAW resonator or a BAW resonator.

The series arm resonator 121s has a resonant frequency frs21 and an anti-resonant frequency fas21. The series arm resonator 122s has a resonant frequency frs22 and an anti-resonant frequency fas22. The parallel arm resonator 121p has a resonant frequency frp21 and an anti-resonant frequency fap21. The parallel arm resonator 122p has a resonant frequency frp22 and an anti-resonant frequency fap22.

The ladder circuit 11, the ladder circuit 12A, and the ladder circuit 13 are cascade-connected in this order from the input/output terminal 110.

Figure 6:
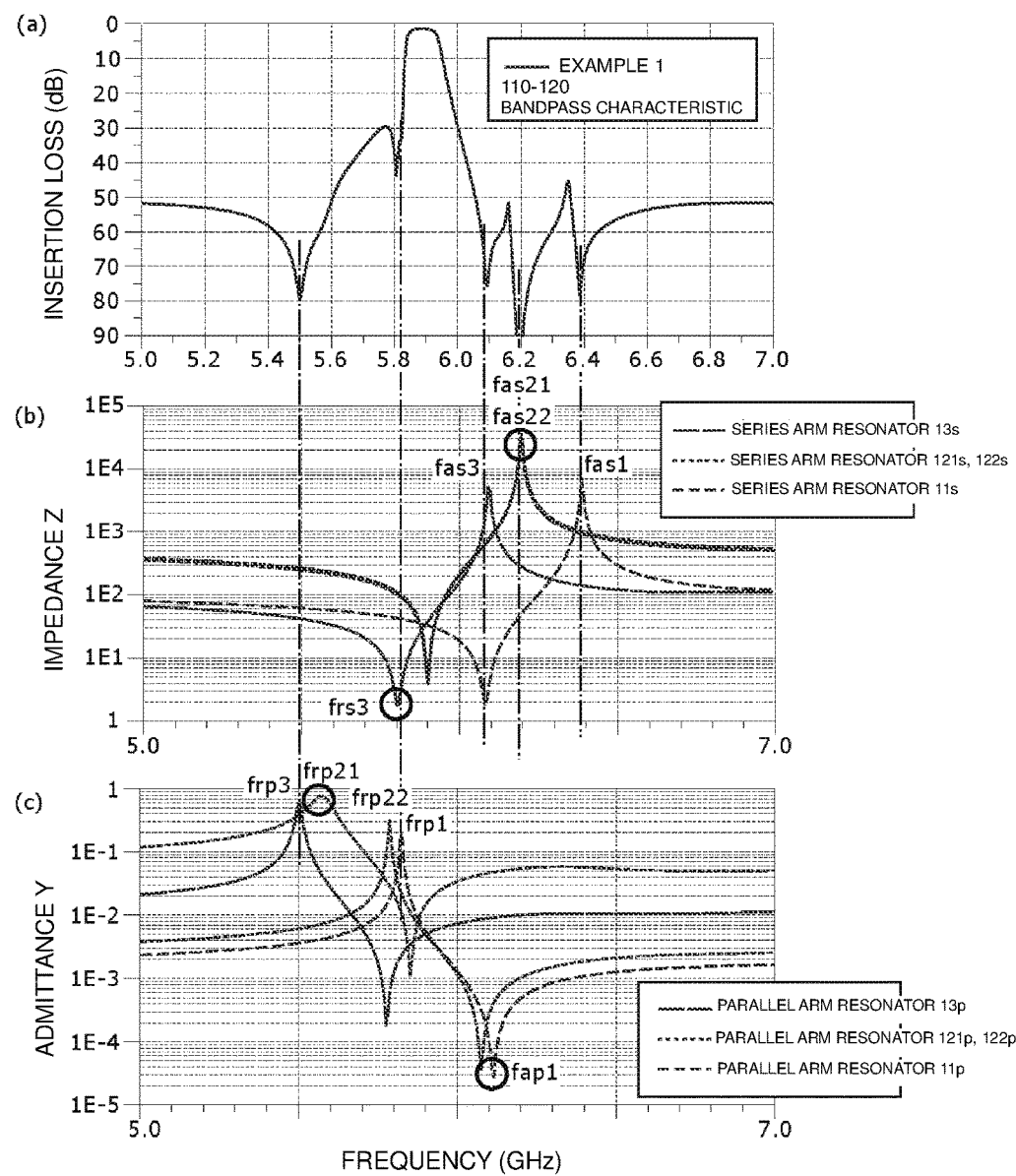
FIG. 6 includes graphs illustrating the bandpass characteristic of the acoustic wave filter according to example 1, the impedance characteristics of series arm resonators, and the admittance characteristics of parallel arm resonators.

FIG. 6 includes graphs, in which part (a) illustrates the bandpass characteristic of the acoustic wave filter 1A according to example 1, part (b) illustrates the impedance characteristics of the series arm resonators, and part (c) illustrates the admittance characteristics of the parallel arm resonators.

As illustrated in parts (b) and (c) of FIG. 6, in the acoustic wave filter 1A, the following expression is satisfied.

$$fas1 > (fas21, fas22) > fas3 > frp1 > (frp21, frp22) > frp3 \quad \text{(Expression 2)}$$

Accordingly, the attenuation pole near the low-frequency side of the pass band of the acoustic wave filter 1A is defined by the resonant frequency frp1, which is the highest among the four resonant frequencies frp1, frp21, frp22, and frp3. On the other hand, the attenuation pole near the high-frequency side of the pass band of the acoustic wave filter 1A is defined by the anti-resonant frequency fas3, which is the lowest among the four anti-resonant frequencies fas1, fas21, fas22, and fas3.

With use of the ladder circuits 11, 12A, and 13 including acoustic wave resonators having a relatively large resonant band width, the acoustic wave filter 1A having a pass band smaller than the resonant band width can be implemented.

In addition, because at least the ladder circuit 12A has a pass band width larger than the pass band width of the acoustic wave filter 1A, a large attenuation can be secured in the attenuation band far from the pass band formed by the ladder circuit 12A. This makes it possible to provide the acoustic wave filter 1A having a large attenuation and a pass band that is narrower than the pass bands and resonant bands of the ladder circuits 11, 12A, and 13.

Among the parallel arm resonators 11p, 121p, 122p, and 13p, the parallel arm resonator 11p may have the smallest capacitance value. Accordingly, the impedance of the parallel arm resonator 11p defining the end portion of the low-frequency side of the pass band of the acoustic wave filter 1A can be increased, and thus the insertion loss at the end portion of the low-frequency side of the pass band of the acoustic wave filter 1A can be reduced.

Among the series arm resonators 11s, 121s, 122s, and 13s, the series arm resonator 13s may have the largest capacitance value. Accordingly, the impedance of the series arm resonator 13s defining the end portion of the high-frequency side of the pass band of the acoustic wave filter 1A can be decreased, and thus the insertion loss at the end portion of the high-frequency side of the pass band of the acoustic wave filter 1A can be reduced.

Among the resonant band width of the parallel arm resonator 11p (fap1−frp1: first parallel resonant band width), the resonant band width of the parallel arm resonator 121p (fap21−frp21: second parallel resonant band width), the resonant band width of the parallel arm resonator 122p (fap22−frp22: second parallel resonant band width), and the resonant band width of the parallel arm resonator 13p (fap3−frp3: third parallel resonant band width), the first parallel resonant band width may be the smallest.

Accordingly, because the resonant band width of the parallel arm resonator 11p defining the attenuation slope near the low-frequency side of the pass band of the acoustic wave filter 1A is the smallest, the attenuation slope can be made steep.

Among the resonant band width of the series arm resonator 11s (fas1−frs1: first series resonant band width), the resonant band width of the series arm resonator 121s (fas21−frs21: second series resonant band width), the resonant band width of the series arm resonator 122s (fas22−frs22: second series resonant band width), and the resonant band width of the series arm resonator 13s (fas3−frs3: third series resonant band width), the third series resonant band width may be the smallest.

Accordingly, because the resonant band width of the series arm resonator 13s defining the attenuation slope near the high-frequency side of the pass band of the acoustic wave filter 1A is the smallest, the attenuation slope can be made steep.

Among the parallel arm resonators 11p, 121p, 122p, and 13p, the parallel arm resonator 121p or 122p may have the largest capacitance value.

Accordingly, in the ladder circuit 12A having a relatively large pass band width and resonant band width, the admittance of the resonant frequency frp21 of the parallel arm resonator 121p or the resonant frequency frp22 of the parallel arm resonator 122p defining the attenuation band on the low-frequency side of the pass band can be increased, as illustrated in part (c) of FIG. 6. This makes it possible to increase the attenuation in the attenuation band that is far on the low-frequency side of the pass band of the acoustic wave filter 1A.

Among the series arm resonators 11s, 121s, 122s, and 13s, the series arm resonator 121s or 122s may have the smallest capacitance value.

Accordingly, in the ladder circuit 12A having a relatively large pass band width and resonant band width, the impedance of the anti-resonant frequency fas21 of the series arm resonator 121s or the anti-resonant frequency fas22 of the series arm resonator 122s defining the attenuation band on the high-frequency side of the pass band can be increased, as illustrated in part (b) of FIG. 6. This makes it possible to increase the attenuation in the attenuation band that is far on the high-frequency side of the pass band of the acoustic wave filter 1A.

Among the resonant band width of the parallel arm resonator 11p (fap1−frp1: first parallel resonant band width), the resonant band width of the parallel arm resonator 121p (fap21−frp21: second parallel resonant band width), the resonant band width of the parallel arm resonator 122p (fap22−frp22: second parallel resonant band width), and the resonant band width of the parallel arm resonator 13p (fap3−frp3: third parallel resonant band width), the second parallel resonant band width may be the largest.

Accordingly, among the ladder circuits 11, 12A, and 13, the ladder circuit 12A has the largest pass band width and the largest resonant band width. Thus, the attenuation band that is far on the low-frequency side of the pass band of the acoustic wave filter 1A can be defined by the resonant frequency frp21 of the parallel arm resonator 121p and the resonant frequency frp22 of the parallel arm resonator 122p, and the attenuation in the attenuation band can be increased.

Among the resonant band width of the series arm resonator 11s (fas1−frs1: first series resonant band width), the resonant band width of the series arm resonator 121s (fas21−frs21: second series resonant band width), the resonant band width of the series arm resonator 122s (fas22−frs22: second series resonant band width), and the resonant band width of the series arm resonator 13s (fas3−frs3: third series resonant band width), the second series resonant band width may be the largest.

Accordingly, among the ladder circuits 11, 12A, and 13, the ladder circuit 12A has the largest pass band width and the largest resonant band width. Thus, the attenuation band that is far on the high-frequency side of the pass band of the acoustic wave filter 1A can be defined by the anti-resonant frequency fas21 of the series arm resonator 121s and the anti-resonant frequency fas22 of the series arm resonator 122s, and the attenuation in the attenuation band can be increased.

Figure 7A:
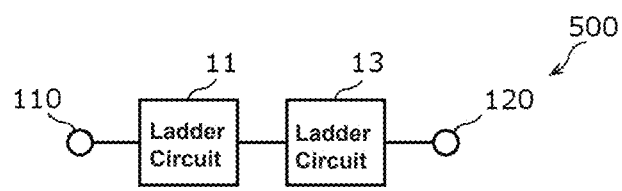
FIG. 7A is a circuit block diagram of an acoustic wave filter according to comparative example 1.

6. Comparison of Bandpass Characteristics of Acoustic Wave Filters According to Example and Comparative Example FIG. 7A is a circuit block diagram of an acoustic wave filter 500 according to comparative example 1. As illustrated in FIG. 7A, the acoustic wave filter 500 according to comparative example 1 includes ladder circuits 11 and 13 and input/output terminals 110 and 120. The acoustic wave filter 500 according to the present comparative example is different from the acoustic wave filter 1 according to the embodiment in that the ladder circuit 12 is not provided.

Figure 7B:
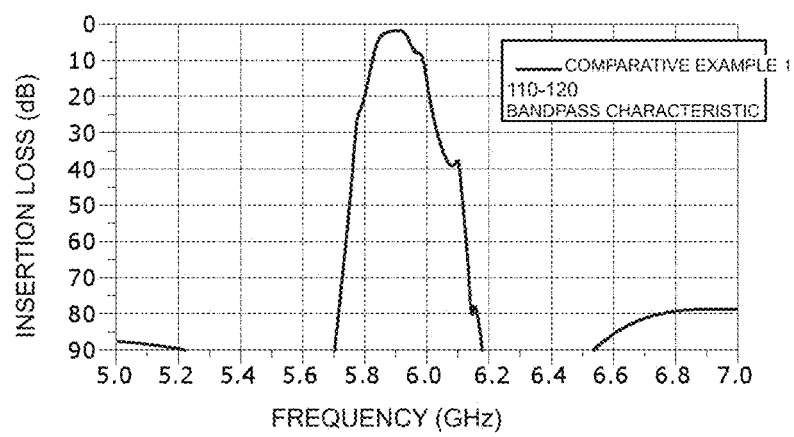
FIG. 7B is a graph illustrating the bandpass characteristic of the acoustic wave filter according to comparative example 1.

FIG. 7B is a graph illustrating the bandpass characteristic of the acoustic wave filter 500 according to comparative example 1. As illustrated in FIG. 7B, the insertion loss (3.00 dB) in the pass band of the acoustic wave filter 500 is larger than the insertion loss (2.12 dB) of the acoustic wave filter 1A according to example 1. In addition, the attenuation slope near the low-frequency side of the pass band and the attenuation slope near the high-frequency side of the pass band do not have a steep linear shape, and an unnecessary convex shape appears.

One of the reasons for this may be that the acoustic wave filter having a narrow pass band is constituted by only the two ladder circuits 11 and 13 having a relatively large pass band width and resonant band width, which increases the impedance mismatching between the ladder circuits 11 and 13. Another reason may be that only the two ladder circuits are used to achieve the narrow pass band, the steepness of the attenuation slope near the pass band, and the attenuation in the attenuation band far from the pass band, which causes insertion loss in the pass band and degradation of characteristics in the attenuation slope near the pass band.

Figure 8A:
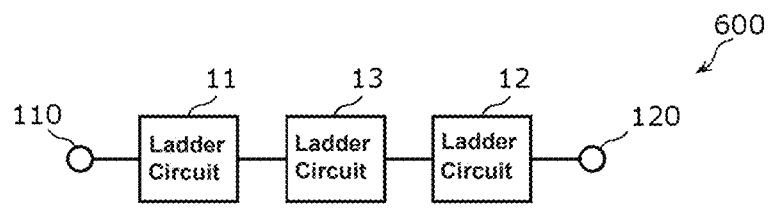
FIG. 8A is a circuit block diagram of an acoustic wave filter according to comparative example 2.

FIG. 8A is a circuit block diagram of an acoustic wave filter 600 according to comparative example 2. As illustrated in FIG. 8A, the acoustic wave filter 600 according to comparative example 2 includes ladder circuits 11, 12, and 13 and input/output terminals 110 and 120. The acoustic wave filter 600 according to the present comparative example is different from the acoustic wave filter 1 according to the embodiment only in the order in which the ladder circuits 11 to 13 are arranged. That is, in the acoustic wave filter 600, the ladder circuit 11, the ladder circuit 13, and the ladder circuit 12 are cascade-connected in this order from the input/output terminal 110.

Figure 8B:
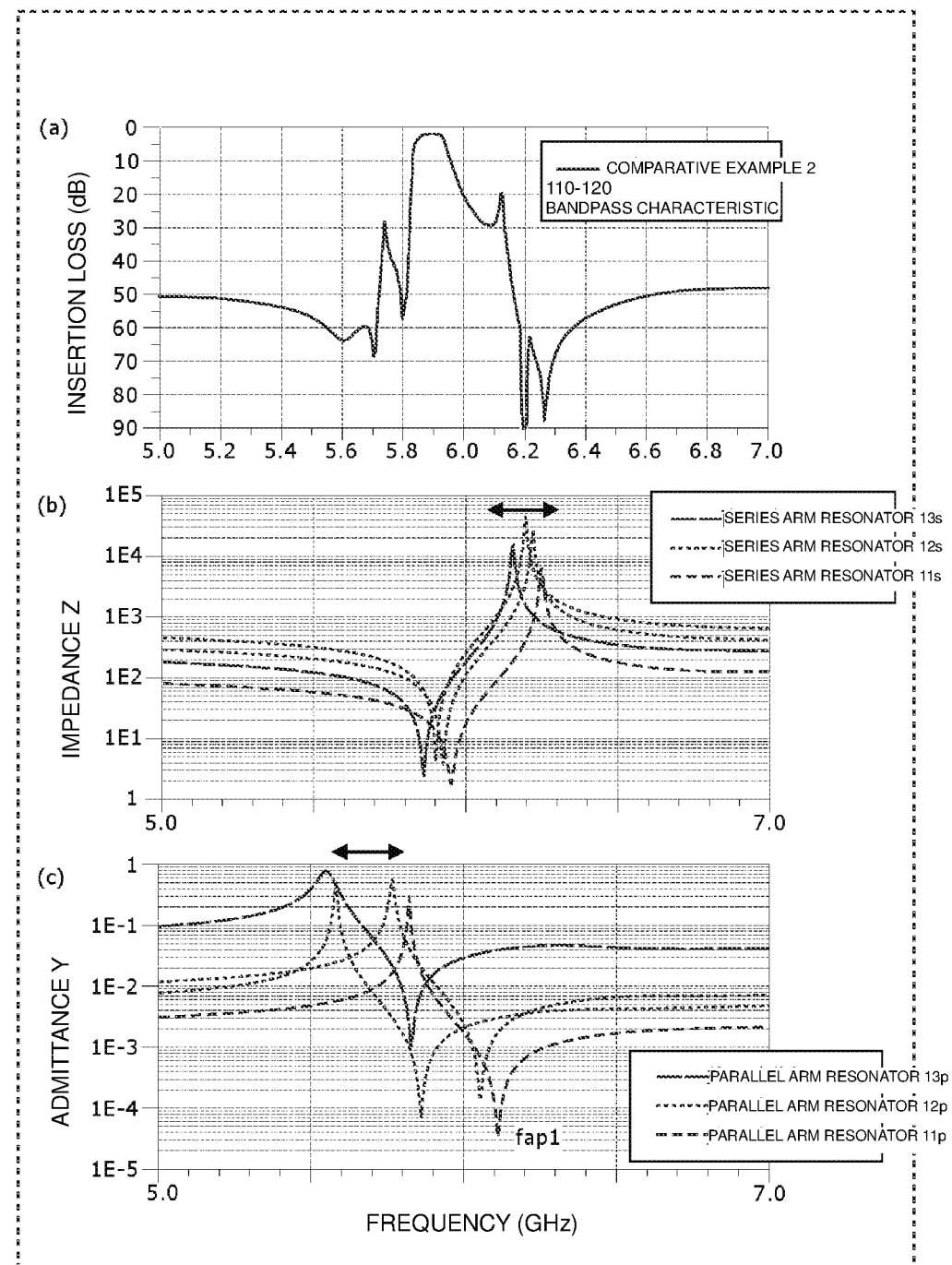
FIG. 8B includes graphs illustrating the bandpass characteristic of the acoustic wave filter according to comparative example 2, the impedance characteristics of series arm resonators, and the admittance characteristics of parallel arm resonators.

FIG. 8B includes graphs, in which part (a) illustrates the bandpass characteristic of the acoustic wave filter 600 according to comparative example 2, part (b) illustrates the impedance characteristics of the series arm resonators 11s to 13s, and part (c) illustrates the admittance characteristics of the parallel arm resonators 11p to 13p.

When the ladder circuits 11 and 13 having a large frequency difference are directly connected to each other as in comparative example 1, insertion loss increases due to impedance mismatching. Thus, in comparative example 2, the frequency difference between the ladder circuits 11 and 13 is made smaller than in comparative example 1. That is, the difference between the resonant frequencies frp1 and frp3 and the difference between the anti-resonant frequencies fas1 and fas3 are made smaller than in comparative example 1. However, the decreased differences in frequency make it difficult to achieve both the attenuation characteristic near the pass band and the attenuation characteristic far from the pass band of the acoustic wave filter 600. In particular, in comparative example 2, a steep attenuation characteristic is not secured near the high-frequency side of the pass band, as illustrated in part (a) of FIG. 8B.

In view of the above results of comparative examples 1 and 2, it is necessary to arrange three ladder circuits having different resonant frequencies in order of frequency between the input/output terminals, as in the acoustic wave filter 1 according to the embodiment and the acoustic wave filter 1A according to example 1, in order to achieve the narrow pass band, the steepness of the attenuation slope near the pass band, and large attenuation in the attenuation band far from the pass band.

In the acoustic wave filter 1 according to the present embodiment, it is desired that the ladder circuit 11 and the ladder circuit 12 be directly connected to each other without via another circuit element, and that the ladder circuit 12 and the ladder circuit 13 be directly connected to each other without via another circuit element.

Accordingly, the frequency difference between adjacent ladder circuits can be reduced, and thus good impedance matching between the adjacent ladder circuits can be achieved. Thus, the acoustic wave filter 1 having a narrow band and low loss can be provided.

Figure 9A:
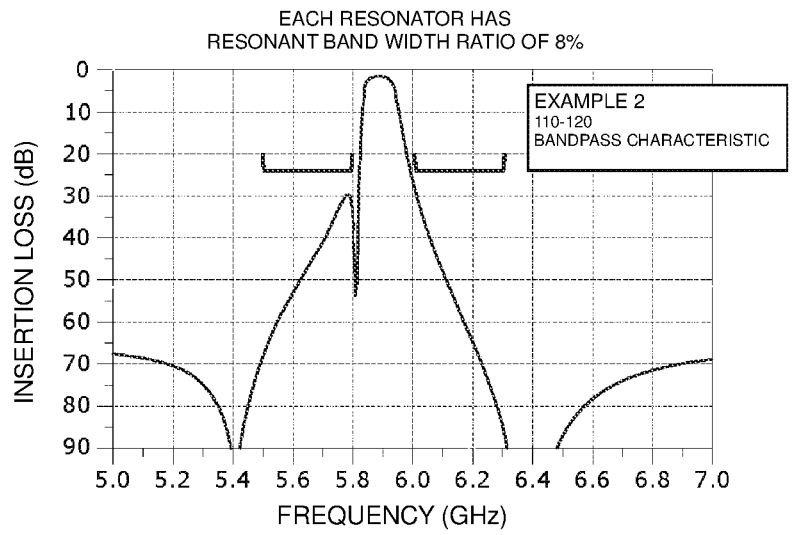
FIG. 9A is a graph illustrating the bandpass characteristic of an acoustic wave filter according to example 2.
Figure 9B:
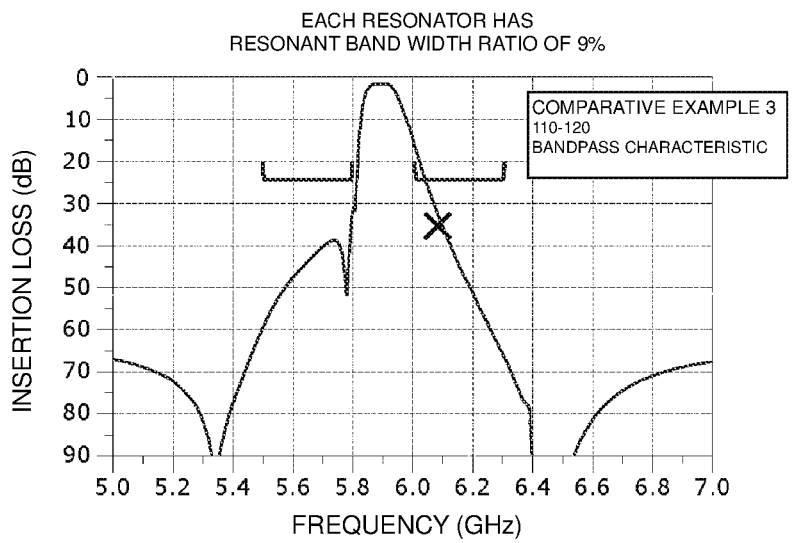
FIG. 9B is a graph illustrating the bandpass characteristic of an acoustic wave filter according to comparative example 3.

7. Relationship Between Resonant Band Width Ratio of Acoustic Wave Resonator and Filter Band Width Ratio of Acoustic Wave Filter FIG. 9A is a graph illustrating the bandpass characteristic of an acoustic wave filter 1B according to example 2. FIG. 9B is a graph illustrating the bandpass characteristic of an acoustic wave filter 700 according to comparative example 3.

The acoustic wave filter 1B according to example 2 and the acoustic wave filter 700 according to comparative example 3 both have a circuit configuration similar to that of the acoustic wave filter 1 according to the embodiment. That is, each of the acoustic wave filter 1B and the acoustic wave filter 700 includes a first ladder circuit, a second ladder circuit, and a third ladder circuit. The first ladder circuit, the second ladder circuit, and the third ladder circuit are cascade-connected in this order from the input/output terminal 110. Here, each of the acoustic wave filter 1B and the acoustic wave filter 700 satisfies Expression 1 given above.

Here, a value obtained by dividing the difference between the anti-resonant frequency and the resonant frequency of one or more first series arm resonators by the resonant frequency is defined as a first series resonant band width ratio. A value obtained by dividing the difference between the anti-resonant frequency and the resonant frequency of one or more second series arm resonators by the resonant frequency is defined as a second series resonant band width ratio. A value obtained by dividing the difference between the anti-resonant frequency and the resonant frequency of one or more third series arm resonators by the resonant frequency is defined as a third series resonant band width ratio. A value obtained by dividing the difference between the anti-resonant frequency and the resonant frequency of one or more first parallel arm resonators by the resonant frequency is defined as a first parallel resonant band width ratio. A value obtained by dividing the difference between the anti-resonant frequency and the resonant frequency of one or more second parallel arm resonators by the resonant frequency is defined as a second parallel resonant band width ratio. A value obtained by dividing the difference between the anti-resonant frequency and the resonant frequency of one or more third parallel arm resonators by the resonant frequency is defined as a third parallel resonant band width ratio. In this case, an average value of the first to third series resonant band width ratios and the first to third parallel resonant band width ratios is defined as a resonant band width ratio of the acoustic wave filter.

In addition, a value obtained by dividing the pass band of the acoustic wave filter by the center frequency of the pass band is defined as a filter band width ratio.

In the acoustic wave filter 1B according to example 2, the resonant band width ratio is 8%, and the filter band width ratio is 1.2%. That is, in the acoustic wave filter 1B, the filter band width ratio is 0.15 times the resonant band width ratio.

On the other hand, in the acoustic wave filter 700 according to comparative example 3, the resonant band width ratio is 9%, and the filter band width ratio is 1.2%. That is, in the acoustic wave filter 700, the filter band width ratio is 0.13 times the resonant band width ratio.

In the acoustic wave filter 1B according to example 2, as illustrated in FIG. 9A, a low loss characteristic in the pass band, the steepness of the attenuation band near the pass band, and the attenuation in the attenuation band far from the pass band are all favorable.

On the other hand, in the acoustic wave filter 700 according to comparative example 3, as illustrated in FIG. 9B, a low loss characteristic in the pass band and the attenuation in the attenuation band far from the pass band are favorable, but the steepness of the attenuation band near the high-frequency side of the pass band is degraded, and required specifications are not satisfied.

The resonant band width ratio implementable by a SAW resonator and a BAW resonator is approximately 3% or more. Thus, in the case of an acoustic wave filter having a filter band width ratio of about 1.2%, the filter band width ratio is 0.4 times or less the resonant band width ratio.

According to the above, the filter band width ratio of the acoustic wave filter 1 according to the present embodiment is desirably 0.15 times or more the resonant band width ratio and 0.4 times or less the resonant band width ratio.

Accordingly, it is possible to provide an acoustic wave filter that has a pass band width sufficiently smaller than a resonant band width and that satisfies a low loss characteristic in the pass band, the steepness of the attenuation band near the pass band, and large attenuation in the attenuation band far from the pass band.

Advantageous Effects and the Like

The acoustic wave filter 1 according to the embodiment includes the input/output terminals 110 and 120; the ladder circuit 11 including the series arm resonator 11s and the parallel arm resonator 11p, the series arm resonator 11s being connected in series to the series arm path connecting the input/output terminals 110 and 120, the parallel arm resonator 11p being connected to the first parallel arm path connecting the series arm path and ground; the ladder circuit 12 including the series arm resonator 12s and the parallel arm resonator 12p, the series arm resonator 12s being connected in series to the series arm path, the parallel arm resonator 12p being connected to the second parallel arm path connecting the series arm path and ground; and the ladder circuit 13 including the series arm resonator 13s and the parallel arm resonator 13p, the series arm resonator 13s being connected in series to the series arm path, the parallel arm resonator 13p being connected to the third parallel arm path connecting the series arm path and ground. The series arm resonators 11s to 13s and the parallel arm resonators 11p to 13p are each an acoustic wave resonator. The ladder circuit 11, the ladder circuit 12, and the ladder circuit 13 are cascade-connected in this order from the input/output terminal 110. fas1>fas2>fas3>frp1>frp2>frp3 is satisfied, where fas1 represents an anti-resonant frequency of the series arm resonator 11s, fas2 represents an anti-resonant frequency of the series arm resonator 12s, fas3 represents an anti-resonant frequency of the series arm resonator 13s, frp1 represents a resonant frequency of the parallel arm resonator 11p, frp2 represents a resonant frequency of the parallel arm resonator 12p, and frp3 represents a resonant frequency of the parallel arm resonator 13p.

With the above-described configuration, with use of the ladder circuits 11 to 13 including acoustic wave resonators having a relatively large resonant band width, the acoustic wave filter 1 having a pass band smaller than the resonant band width can be implemented. In addition, because at least the ladder circuit 12 has a pass band width larger than the pass band width of the acoustic wave filter 1, a large attenuation can be secured in the attenuation band far from the pass band formed by the ladder circuit 12. This makes it possible to provide the acoustic wave filter 1 having a large attenuation and a pass band that is narrower than the pass bands and resonant bands of the ladder circuits 11 to 13. Furthermore, because the ladder circuits 11, 12, and 13 are arranged in this order between the input/output terminals 110 and 120, the frequency difference between adjacent ladder circuits can be reduced. This makes it possible to achieve good impedance matching between adjacent ladder circuits. Thus, mismatching loss between the ladder circuits can be reduced, and the acoustic wave filter 1 having low loss can be provided.

In the acoustic wave filter 1, among the parallel arm resonators 11p to 13p, the parallel arm resonator 11p may have the smallest capacitance value.

Accordingly, the impedance of the parallel arm resonator 11p defining the end portion of the low-frequency side of the pass band of the acoustic wave filter 1A can be increased, and thus the insertion loss at the end portion of the low-frequency side of the pass band of the acoustic wave filter 1A can be reduced.

In the acoustic wave filter 1, among the series arm resonators 11s to 13s, the series arm resonator 13s may have the largest capacitance value.

Accordingly, the impedance of the series arm resonator 13s defining the end portion of the high-frequency side of the pass band of the acoustic wave filter 1A can be decreased, and thus the insertion loss at the end portion of the high-frequency side of the pass band of the acoustic wave filter 1A can be reduced.

In the acoustic wave filter 1, among the first parallel resonant band width, the second parallel resonant band width, and the third parallel resonant band width, the first parallel resonant band width may be the smallest.

Accordingly, because the resonant band width of the parallel arm resonator 11p defining the attenuation slope near the low-frequency side of the pass band of the acoustic wave filter 1 is the smallest, the attenuation slope can be made steep.

In the acoustic wave filter 1, among the first series resonant band width, the second series resonant band width, and the third series resonant band width, the third series resonant band width may be the smallest.

Accordingly, because the resonant band width of the series arm resonator 13s defining the attenuation slope near the high-frequency side of the pass band of the acoustic wave filter 1 is the smallest, the attenuation slope can be made steep.

In the acoustic wave filter 1, among the parallel arm resonators 11p to 13p, the parallel arm resonator 12p may have the largest capacitance value.

Accordingly, in the ladder circuit 12 having a relatively large pass band width and resonant band width, the admittance of the resonant frequency frp2 of the parallel arm resonator 12p defining the attenuation band on the low-frequency side of the pass band can be increased. This makes it possible to increase the attenuation in the attenuation band that is far on the low-frequency side of the pass band of the acoustic wave filter 1.

In the acoustic wave filter 1, among the series arm resonators 11s to 13s, the series arm resonator 12s may have the smallest capacitance value.

Accordingly, in the ladder circuit 12 having a relatively large pass band width and resonant band width, the impedance of the anti-resonant frequency fas2 of the series arm resonator 12s defining the attenuation band on the high-frequency side of the pass band can be increased. This makes it possible to increase the attenuation in the attenuation band that is far on the high-frequency side of the pass band of the acoustic wave filter 1.

In the acoustic wave filter 1, among the first parallel resonant band width, the second parallel resonant band width, and the third parallel resonant band width, the second parallel resonant band width may be the largest.

Accordingly, among the ladder circuits 11 to 13, the ladder circuit 12 has the largest pass band width and the largest resonant band width. Thus, the attenuation band that is far on the low-frequency side of the pass band of the acoustic wave filter 1 can be defined by the resonant frequency frp2 of the parallel arm resonator 12p, and the attenuation in the attenuation band can be increased.

In the acoustic wave filter 1, among the first series resonant band width, the second series resonant band width, and the third series resonant band width, the second series resonant band width may be the largest.

Accordingly, among the ladder circuits 11 to 13, the ladder circuit 12 has the largest pass band width and the largest resonant band width. Thus, the attenuation band that is far on the high-frequency side of the pass band of the acoustic wave filter 1 can be defined by the anti-resonant frequency fas2 of the series arm resonator 12s, and the attenuation in the attenuation band can be increased.

In the acoustic wave filter 1, the ladder circuit 11 and the ladder circuit 12 may be directly connected to each other without via another circuit element, and the ladder circuit 12 and the ladder circuit 13 may be directly connected to each other without via another circuit element.

Accordingly, the frequency difference between adjacent ladder circuits can be reduced, and thus good impedance matching between the adjacent ladder circuits can be achieved. Thus, the acoustic wave filter 1 having a narrow band and low loss can be provided.

In the acoustic wave filter 1, the filter band width ratio may be 0.15 times or more the resonant band width ratio and may be 0.4 times or less the resonant band width ratio.

Accordingly, it is possible to provide the acoustic wave filter 1 that has a pass band width sufficiently smaller than a resonant band width and that satisfies a low loss characteristic in the pass band, the steepness of the attenuation band near the pass band, and large attenuation in the attenuation band far from the pass band.

OTHER EMBODIMENTS

While the acoustic wave filters according to an embodiment, examples, and modifications of the present invention have been described, the present invention is not limited to the above-described embodiment, examples, and modifications. Another embodiment implemented by combining any constituent elements in the above embodiment, examples, and modifications, a modification obtained by applying various changes conceived by those skilled in the art to the above embodiment without departing from the gist of the present invention, and various devices including the acoustic wave filter according to the present invention are also included in the present invention.

For example, in the acoustic wave filters according to the above embodiment, examples, and modifications, a matching element, such as an inductor or a capacitor, and a switch circuit may be connected between circuit elements, unless otherwise specified. The inductor may include a wiring inductor formed of a wiring line connecting circuit elements.

The present invention can be widely used, as an acoustic wave filter applicable to a multiband system, in communication devices such as mobile phones.

What is claimed is:

1. An acoustic wave filter comprising:
   a first input/output terminal;
   a second input/output terminal;
   a first ladder circuit including a first series arm resonator and a first parallel arm resonator, the first series arm resonator being connected in series to a series arm path connecting the first input/output terminal and the second input/output terminal, the first parallel arm resonator being connected to a first parallel arm path connecting the series arm path and ground;
   a second ladder circuit including a second series arm resonator and a second parallel arm resonator, the second series arm resonator being connected in series to the series arm path, the second parallel arm resonator being connected to a second parallel arm path connecting the series arm path and ground; and
   a third ladder circuit including a third series arm resonator and a third parallel arm resonator, the third series arm resonator being connected in series to the series arm path, the third parallel arm resonator being connected to a third parallel arm path connecting the series arm path and ground, wherein
   the first ladder circuit, the second ladder circuit, and the third ladder circuit are cascade-connected in order, and
   a condition of fas1>fas2>fas3>frp1>frp2>frp3 is satisfied, where fas1 represents an anti-resonant frequency of the first series arm resonator, fas2 represents an anti-resonant frequency of the second series arm resonator, fas3 represents an anti-resonant frequency of the third series arm resonator, frp1 represents a resonant frequency of the first parallel arm resonator, frp2 represents a resonant frequency of the second parallel arm resonator, and frp3 represents a resonant frequency of the third parallel arm resonator.

2. The acoustic wave filter according to claim 1, wherein among the first parallel arm resonator, the second parallel arm resonator, and the third parallel arm resonator, the first parallel arm resonator has a smallest capacitance value.

3. The acoustic wave filter according to claim 1, wherein among the first series arm resonator, the second series arm resonator, and the third series arm resonator, the third series arm resonator has a largest capacitance value.

4. The acoustic wave filter according to claim 1, wherein
a first parallel resonant band width being a difference between an anti-resonant frequency of the first parallel arm resonator and the resonant frequency of the first parallel arm resonator,
a second parallel resonant band width being a difference between an anti-resonant frequency of the second parallel arm resonator and the resonant frequency of the second parallel arm resonator,
a third parallel resonant band width being a difference between an anti-resonant frequency of the third parallel arm resonator and the resonant frequency of the third parallel arm resonator, and
among the first parallel resonant band width, the second parallel resonant band width, and the third parallel resonant band width, the first parallel resonant band width is smallest.

5. The acoustic wave filter according to claim 1, wherein
a first series resonant band width being a difference between the anti-resonant frequency of the first series arm resonator and a resonant frequency of the first series arm resonator,
a second series resonant band width being a difference between the anti-resonant frequency of the second series arm resonator and a resonant frequency of the second series arm resonator,
a third series resonant band width being a difference between the anti-resonant frequency of the third series arm resonator and a resonant frequency of the third series arm resonator, and
among the first series resonant band width, the second series resonant band width, and the third series resonant band width, the third series resonant band width is smallest.

6. The acoustic wave filter according to claim 1, wherein among the first parallel arm resonator, the second parallel arm resonator, and the third parallel arm resonator, the second parallel arm resonator has a largest capacitance value.

7. The acoustic wave filter according to claim 1, wherein among the first series arm resonator, the second series arm resonator, and the third series arm resonator, the second series arm resonator has a smallest capacitance value.

8. The acoustic wave filter according to claim 1, wherein
a first parallel resonant band width being a difference between an anti-resonant frequency of the first parallel arm resonator and the resonant frequency of the first parallel arm resonator,
a second parallel resonant band width being a difference between an anti-resonant frequency of the second parallel arm resonator and the resonant frequency of the second parallel arm resonator,
a third parallel resonant band width being a difference between an anti-resonant frequency of the third parallel arm resonator and the resonant frequency of the third parallel arm resonator, and
among the first parallel resonant band width, the second parallel resonant band width, and the third parallel resonant band width, the second parallel resonant band width is largest.

9. The acoustic wave filter according to claim 1, wherein
a first series resonant band width being a difference between the anti-resonant frequency of the first series arm resonator and a resonant frequency of the first series arm resonator,
a second series resonant band width being a difference between the anti-resonant frequency of the first series arm resonator and a resonant frequency of the first series arm resonator,
a third series resonant band width being a difference between the anti-resonant frequency of the first series arm resonator and a resonant frequency of the first series arm resonator, and
among the first series resonant band width, the second series resonant band width, and the third series resonant band width, the second series resonant band width is largest.

10. The acoustic wave filter according to claim 1, wherein
the first ladder circuit and the second ladder circuit are directly connected to each other without another circuit element therebetween, and
the second ladder circuit and the third ladder circuit are directly connected to each other without another circuit element therebetween.

11. The acoustic wave filter according to claim 1, wherein
a filter band width ratio is 0.15 times or more a resonant band width ratio and is 0.4 times or less the resonant band width ratio,
the filter band width ratio being a value obtained by dividing a pass band of the acoustic wave filter by a center frequency of the pass band, and
the resonant band width ratio being an average value of:
  a first series resonant band width ratio obtained by dividing a difference between the anti-resonant frequency of the first series arm resonator and a resonant frequency of the first series arm resonator by the resonant frequency of the first series arm resonator;
  a second series resonant band width ratio obtained by dividing a difference between the anti-resonant frequency of the second series arm resonator and a resonant frequency of the second series arm resonator by the resonant frequency of the second series arm resonator;
  a third series resonant band width ratio obtained by dividing a difference between the anti-resonant frequency of the third series arm resonator and a resonant frequency of the third series arm resonator by the resonant frequency of the third series arm resonator;
  a first parallel resonant band width ratio obtained by dividing a difference between an anti-resonant frequency of the first parallel arm resonator and the resonant frequency of the first parallel arm resonator by the resonant frequency of the first parallel arm resonator;
  a second parallel resonant band width ratio obtained by dividing a difference between an anti-resonant frequency of the second parallel arm resonator and the resonant frequency of the second parallel arm resonator by the resonant frequency of the second parallel arm resonator; and
  a third parallel resonant band width ratio obtained by dividing a difference between an anti-resonant frequency of the third parallel arm resonator and the resonant frequency of the third parallel arm resonator by the resonant frequency of the third parallel arm resonator.

12. The acoustic wave filter according to claim 1, wherein the acoustic wave filter is configured to provide a bandwidth of 5855 MHz through 5925 MHz.

13. The acoustic wave filter according to claim 12, each of the first ladder circuit, the second ladder circuit and the third ladder circuit have a resonant bandwidth of 5150 MHz through 5925 MHz.

14. The acoustic wave filter according to claim 12, wherein the first ladder circuit, second ladder circuit and third ladder circuit are configured as a low-loss filter for band n47 of $5^{th}$ Generation New Radio (5G NR).

15. The acoustic wave filter according to claim 1, wherein the acoustic wave filter is configured to provide a bandwidth of 5925 MHz through 7125 MHz.

16. The acoustic wave filter according to claim 15, each of the first ladder circuit, the second ladder circuit and the third ladder circuit having a resonant bandwidth of 5925 MHz through 7125 MHz to correspond with a band n97 of $5^{th}$ Generation New Radio (5G NR).

17. The acoustic wave filter according to claim 1, wherein the acoustic wave filter is configured to provide a bandwidth of 3400 MHz through 3600 MHz.

18. The acoustic wave filter according to claim 1, wherein the acoustic wave filter is configured to provide a bandwidth of 3550 MHz through 3700 MHz.

19. The acoustic wave filter according to claim 1, wherein the acoustic wave filter is configured to provide a bandwidth of 3300 MHz through 3400 MHz.

20. The acoustic wave filter according to claim 1, wherein the acoustic wave filter is one of a solidly mounted resonator (SMR) or a film bulk acoustic resonator (FBAR).

* * * * *